United States Patent
Miyawaki et al.

(10) Patent No.: US 6,466,508 B1
(45) Date of Patent: Oct. 15, 2002

(54) SEMICONDUCTOR MEMORY DEVICE HAVING HIGH-SPEED READ FUNCTION

(75) Inventors: Yoshikazu Miyawaki; Shinichi Kobayashi, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/722,686

(22) Filed: Nov. 28, 2000

(51) Int. Cl.$^7$ .................................................. G11C 8/00
(52) U.S. Cl. ............................. 365/230.03; 365/230.01
(58) Field of Search ............................ 365/230.03, 205, 365/230.01

(56) References Cited

U.S. PATENT DOCUMENTS 5,301,153 A * 4/1994 Johnson ........................ 365/200
5,325,329 A * 6/1994 Inoue et al. ............... 365/189.05

FOREIGN PATENT DOCUMENTS

JP        0087396    * 3/1990    ............ G11C/27/00

OTHER PUBLICATIONS

Betty Prince, "Semiconductor Memories", 1983, Wiley, 2$^{nd}$ pp. 418–420.*

* cited by examiner

*Primary Examiner*—David Nelms
*Assistant Examiner*—M. Tran
(74) *Attorney, Agent, or Firm*—McDermott, Will & Emery

(57) ABSTRACT

The semiconductor memory device receives K addresses from first to Kth addresses having at least one bit in common (where K is a natural number; K≧2). Each data block is divided into a plurality of sub data blocks, and a plurality of sense amplifier circuits are provided corresponding to the respective sub data blocks. In each data block, K read data are selected in response to the first address input. Each of the K read data is amplified and output by one of the plurality of sense amplifier circuits sequentially selected in response to each address input.

7 Claims, 15 Drawing Sheets

SEMICONDUCTOR MEMORY DEVICE HAVING HIGH-SPEED READ FUNCTION

BACKGROUND OF THE INVENTION

1. Field of the Invention

The present invention generally relates to a semiconductor memory device, and more particularly, to a semiconductor memory device conducting a high-speed page-mode read operation.

2. Description of the Background Art

With improvement in performance of microprocessors and the like, semiconductor memory devices including random access memories (RAMs) have been strongly required to have both increased capacity and speed.

FIG. 16 is a schematic block diagram showing the structure associated with the read operation of a conventional typical semiconductor memory device.

Referring to FIG. 16, a conventional semiconductor memory device 100 includes a memory cell array 10 having a plurality of memory cells arranged in a matrix. For example, memory cell array 10 is divided into eight data blocks DB0 to DB7. Note that, hereinafter, each data block DB0 to DB7 is sometimes generally referred to as data block DB.

An address signal Add used for address selection in memory cell array 10 is input from the outside as a 16-bit signal of address bits A0 to A15. The address bits A0 to A9 of the address signal Add select a memory cell row, whereas the address bits A10 to A15 select a memory cell column. A row address buffer 20 receives the address bits A0 to A9 used for row selection. A column address buffer 30 receives the address bits A10 to A15 used for column selection.

Row address buffer 20 and column address buffer 30 produce an internal address signal Add corresponding to the externally input address bits A0 to A15. The internal address signal Add has internal address bits a0 to a15. The internal address bits a0 to a9 are transmitted to a row decoder 40, whereas the internal address bits a10 to a15 are transmitted to a column decoder 50.

Row decoder 40 selectively activates a word line WL (not shown) provided for each memory cell row, according to the internal address bits a0 to a9. Thus, a memory cell row according to the internal address bits a0 to a9 is selected in each data block DB.

In each data block, m bit lines BL (not shown) are provided corresponding to the respective memory cell columns (where m is a natural number).

Semiconductor memory device 100 further includes column selection circuits YG0 to YG7 and sense amplifier circuits SA0 to SA7 provided corresponding to the respective data blocks DB0 to DB7. Note that, like data block DB, each sense amplifier circuit and each column selection circuit are hereinafter sometimes generally referred as sense amplifier circuit SA and column selection circuit YG, respectively.

Each column selection circuit YG selects a single bit line BL in the corresponding data block DB according to the internal address bits a10 to a15, and couples that bit line BL to the corresponding sense amplifier circuit SA. For example, column selection circuit YG0 selects one of the m bit lines BL provided in data block DB0, and couples the bit line BL to sense amplifier circuit SA0.

Semiconductor memory device 100 further includes an address transition detection circuit (hereinafter, simply referred to as an ATD generation circuit) 60. ATD generation circuit 60 receives the internal address bits a0 to a15, and activates an address transition detection signal/ATD as one-shot pulse for a prescribed period when the signal level of at least one internal address bit is changed.

Each sense amplifier circuit SA conducts a bit-line precharging operation in response to activation of tie address transition detection signal/ATD. When the address transition detection signal/ATD is inactivated thereafter, the voltage on the precharged bit line changes according to the data stored in the memory cells connected to the bit line.

Sense amplifier circuits SA0 to SA7 sense such a change in voltage on the corresponding bit line, and outputs read data SD0 to SD7, respectively. The read data SD0 to SD7 is transmitted to an output buffer 70. Output buffer 70 buffers the read data SD0 to SD7 from sense amplifier circuits SA0 to SA7, and outputs the data to the outside as output data D0 to D7 of semiconductor memory device 100.

FIG. 17 is a diagram illustrating column selection in semiconductor memory device 100.

Referring to FIG. 17, column selection circuits YG provided corresponding to the respective data blocks DB conduct m: 1 column selection. Each column selection circuit YG has m column selection switches YS0 to YSm−1 provided corresponding to m bit lines BL1 to BLm−1, respectively. Column selection switches YS0 to YSm−1 are respectively turned ON in response to activation of column selection signals Y0 to Ym−1. Column decoder 50 selectively activates one of the m column selection signals Y0 to Ym−1 according to combination of the signal levels of the internal address bits a10 to a15.

Each column selection circuit YG couples one of the m bit lines BL1 to BLm−1 to the corresponding sense amplifier circuit SA. Sense amplifier circuit SA precharges that bit line in response to activation of the address transition detection signal/ATD, in order to read new data. The address transition activation signal/ATD is inactivated again after a prescribed period. Therefore, sense amplifier circuit SA senses a change in voltage caused by the memory cells connected to the precharged bit line, thereby outputting the read data SD.

FIG. 18 is a timing chart illustrating the read operation of semiconductor memory device 100.

Referring to FIG. 18, addresses #A0 to #A6 are sequentially selected by the address signal Add. The address transition detection signal/ATD is activated in response to address transition. In response to respective activation of the address transition detection signal/ATD, sense amplifier circuits SA0 to SA7 conduct a new data read operation, thereby outputting read data groups #SD0 to #SD6 corresponding to the addresses #A0 to #A6, respectively.

Output buffer 70 buffers the read data groups #SD0 to #SD7, thereby outputting the output data groups #D0 to #D7, respectively.

Current consumption of the read operation is given by the sum of a charging current Ich for charging the bit line in response to activation of the address transition detection signal/ATD, and a stationary current Ice consisting of a current steadily consumed by the sense amplifier and a memory cell current flowing into the memory cells upon reading the data.

In the conventional semiconductor memory device, the data reading speed is dependent on a memory cell current flowing into the memory cells upon reading the data, and a bit-line load for charging the bit line. Therefore, cell-size reduction for increased capacity and increase in data reading speed are opposed to each other, whereby the increase in data reading speed has been limited.

Such a problem is conventionally overcome by the page-mode reading. In general, the page-mode reading is a read operation in which a plurality of memory cells are accessed by sequentially changing the column while the row selection is fixed.

Fig 19 is a schematic block diagram showing the structure associated with the read operation of a conventional semiconductor memory device 110 for conducting the page-mode read operation at 2 bytes/page.

Referring to FIG. 19, in semiconductor memory device 110, each data block DB0 to DB7 is divided into two sub data blocks in order to conduct the page-mode reading. For example, data block DB0 is divided into two sub data blocks SDB0a and SDB0b. Note that, hereinafter, each sub data block is sometimes generally referred to as sub data block SDB.

Moreover, one of the two sub data blocks of each data block, i.e., SDB0a to SDB7a, is hereinafter sometimes generally referred to as sub data block SDBa, whereas the other of the two sub data blocks of each data block, i.e., SDB0b to SDB7b, is sometimes generally referred to as sub data block SDBb.

A column selection circuit YG and a sense amplifier circuit SA are provided for each sub data block. For example, in data block DB0, a sense amplifier circuit SA0a and a column selection circuit YG0a are provided for sub data block SDB0a, whereas a sense amplifier circuit SA0b and a column selection circuit YG0b are provided for sub data block SDB0b.

Hereinafter, each sense amplifier circuit SA0a to SA7a and each column selection circuit YG0a to YG7a provided for sub data blocks SDBa are sometimes generally referred to as sense amplifier circuit SAa and column selection circuit YGa, and each sense amplifier circuit SA0b to SA7b and each column selection circuit YG0b to YG7b provided for sub data blocks SDBb are sometimes generally referred to as sense amplifier circuit SAb and column selection circuit YGb, respectively.

In semiconductor memory device 110, address bits A1 to A6 of address bits A0 to A16 are used for memory cell column selection, whereas the address bits A7 to A16 are used for memory cell row selection. Address bit A0 is used for selecting one of two sub data blocks in each data block.

Semiconductor memory device 110 includes a column decoder 51 for conducting a decode operation corresponding to the least significant address bit A0, and a column decoder 50 for decoding the remaining address bits A1 to A6 used for column selection Sense amplifier circuits SA0a to SA7b corresponding to the sub data blocks SDB0a to SDB7b respectively output read data SD0a to SD7b.

Semiconductor memory device 110 further includes multiplexers MX0 to MX7 provided corresponding to the respective data blocks DB0 to DB7. Hereinafter, each multiplexer MX0 to MX7 is sometimes generally referred to as multiplexer MX.

Each multiplexer MX selectively outputs one of a plurality of sense amplifier data received from the two sense amplifier circuits of the corresponding data block DB. An output buffer 70 buffers read data SD0 to SD7 selectively output from multiplexers MX, and then outputs the data to the outside of semiconductor memory device 110 as output data D0 to D7.

FIG. 20 is a diagram illustrating column selection in semiconductor memory device 110.

Referring to FIG. 20, each sub data block SDBa, SDBb includes j bit lines BL0 to BLj-1 selected according to internal address bits a1 to a6 (where j is a natural number). Column decoder 50 selectively activates one of j column selection signals Y2 to Yj+1 according to the internal address bits a1 to a6.

Each column selection circuit YGa has a plurality of column selection switches provided between the sense amplifier circuit SAa and the respective bit lines BL0 to BLj-1 and turned ON in response to the respective column selection signals Y2 to Yj+1. Thus, in each sub data block SDBa, a single bit line selected according to the internal address bits a1 to a6 is coupled to the corresponding sense amplifier circuit SAa.

Similarly, each column selection circuit YGb has a plurality of column selection switches provided between the sense amplifier circuit SAb and the respective bit lines BL0 to BLj-1 and turned ON in response to the respective column selection signals Y2 to Yj+1. Thus, in each sub data block SDBb, a bit line selected according to the internal address bits a1 to a6 is similarly coupled to the corresponding sense amplifier circuit SAb.

In response to an address transition detection signal/ATD, sense amplifier circuits SAa and SAb conduct a new data read operation based on the change in voltage on the bit line selectively coupled thereto. Sense amplifier circuits SAa and SAb respectively output read data SDa and SDb.

Accordingly, each data block DB outputs two read data SDa and SDb in parallel.

Each multiplexers MX has a plurality of column selection switches coupled between the output buffer 70 and the respective sense amplifier circuits SAa and SAb and operating in response to the respective column selection signals Y0 and Y1.

Column decoder 51 activates one of the column selection signals Y0 and Y1 according to the level of the least significant internal address bit a0. Therefore, each multiplexer MX transmits one of the read data SDa and SDb to output buffer 70 as read data SD from the corresponding data block DB.

FIG 21 is a timing chart illustrating the read operation of semiconductor memory device 110.

Referring to FIG. 21, in the 2-byte/page page-mode read operation, successively input two address signals ADD such as addresses #A0 and #A1 are different from each other only in the least significant address bit A0. As a result, only a column to be selected can be changed by the successively input two addresses.

Hereinafter, the period during which a plurality of address signals ADD having common upper bits are input is also referred to as an "address cycle." In the same address cycle, the address bits except for the least significant address bit A0, i.e., the address bits A1 to A16, are the same. For example, the addresses #A0 and #A1 form the same address cycle.

Every tie the address cycle is updated, the address transition detection signal/ATD is activated in a one-shot manner.

The address transition detection signal/ATD is activated according to the input of a new address #A0. In response to this, in each data block DB, sense amplifier circuits SA0a to SA7a read a read data group #SD0 corresponding to the address #A0, and sense amplifier circuits SA0b to SA7b read a read data group #SD1 corresponding to the address #A1.

Multiplexers MX0 to MX7 transmit one of the read data groups #SD0 and #SD1 to output buffer 70 according to the least significant address bit A0. Therefore, output data groups #D0 and #D1 respectively corresponding to the addresses #A0 and #A1 can be successively output in response to the change in the address signal Add. The page-mode reading in the address cycle started corresponding to the input of an address #A2, #A4, #A6 is conducted similarly.

In such page-mode reading, two sense amplifier circuits SAa and SAb corresponding to the respective sub data blocks SDB operate in parallel in each data block DB, so that the data read operations corresponding to two internal addresses of the same address cycle are conducted in parallel. Therefore, the output data in response to switching of the address bit A0 (corresponding to the data groups #D1, #D3, #D5, #D7 in FIG. 21) can be read at a high speed. Accordingly, the normal access similar to that of semiconductor memory device 100 shown in FIG. 16 and the rapid access are alternately present, whereby the overall data reading speed of semiconductor memory device 110 can be increased.

In semiconductor memory device 110 for conducting the 2-byte/page page-mode reading, the number of sense amplifiers to be operated and the number of bit lines to be coupled to the sense amplifier circuit are both twice those of semiconductor memory device 100 shown in FIG. 16. Therefore, the bit-line charging current is increased to 2·Ich, and the stationary current also increased to 2·Ice.

In the 2-byte/page page-mode reading, an address changes only once within the same address cycle. Therefore, it is difficult to increase the data reading speed dramatically. Accordingly, the number of addresses to be successively input in the same address cycle is increased. For example, a semiconductor memory device has been developed which conducts the page-mode reading at 4 bytes/page by using the lower two bits of internal address bits.

FIG. 22 is a schematic block diagram illustrating the structure associated with the read operation of a semiconductor memory device 120 for conducting the page-mode reading at 4 bytes/page.

Referring to FIG. 22, semiconductor memory device 120 is different from semiconductor memory device 110 for conducting the 2-byte/page page-mode reading in that each data block DB0 to DB7 is divided into four sub data blocks. For example, data block DB0 is divided into sub data blocks SDB0a to SDB0d. In each data block, four column selection circuits and four sense amplifier circuits are provided corresponding to the respective sub data blocks.

Each multiplexer MX selectively outputs one of a plurality of sense amplifier data received from the four sense amplifier circuits of the corresponding data block DB. An output buffer 70 buffers the read data SD0 to SD7 selectively output from multiplexers MX, and outputs the data to the outside of semiconductor memory device 110 as output data D0 to D7.

A column decoder 51 switches data selection in each multiplexer MX according to the lower two bits a0 and a1 of internal address bits.

FIG. 23 is a diagram illustrating the column selection operation in semiconductor memory device 120 of FIG. 22. Since column selection is conducted similarly in each data block DB, FIG. 23 exemplary shows column selection in data block DB0.

In each sub data block SDB0a to SDB0d, k bit lines BL0 to BLk−1 that are selected according to the internal address bits a2 to a6 are provided (where k is a natural number). A column decoder 50 selectively activates one of k column selection signals Y4 to Yk+3 according to the internal address bits a2 to a6.

A column selection circuit YG0a has a plurality of column selection switches provided between the sense amplifier circuit SA0a and the respective bit lines BL0 to BLk−1 and turned ON in response to the respective column selection signals Y4 to Yk+3. Thus, in sub data block SDB0a, a single bit line selected according to the internal address bits a2 to a6 are coupled to sense amplifier circuit SA0a.

Column selection circuits YG0b to YG0d have the same structure. Accordingly, in data blocks SDB0a to SDB0d, the bit lines selected according to the internal address bits a2 to a6 are respectively coupled to the corresponding sense amplifier circuits SA0a to SA0d.

In response to an address transition detection signal/ATD, sense amplifier circuits SA0a to SA0d conducts a new data read operation based on the change in voltage on the bit line selectively coupled thereto. Sense amplifier circuits SA0a to SA0d respectively output read data SD0a to SD0d. Accordingly, in data block DB0, four read data SD0a to SD0d are output in response to a single internal address signal Add.

Multiplexer MX0 has a plurality of column selection switches coupled between the output buffer 70 and the respective sense amplifier circuits SA0a to SA0d and operating in response to the respective column selection signals Y0 to Y3.

Column decoder 51 activates one of the column selection signals Y0 to Y4 according to the level of the lower internal address bits a0 and a1. Accordingly, multiplexer MX0 transmits one of the read data SD0a to SD0d to output buffer 70 as read data SD0 from data block DB0.

FIG. 24 is a timing chart illustrating the read operation of semiconductor memory device 120 of FIG. 22.

Referring to FIG. 24, in the 4-byte/page page-mode operation, four address signals ADD are successively input within the same address cycle The four address signals ADD are different from each other in the lower two bits A0 and A1 of their address bits. For example, the address bits A0 and A1 contained in the four address signals of the same cycle change in the following order: (A0, A1)=(0, 0), (0, 1), (1, 0) and (1, 1).

In the same address cycle, the address bits except for the lower two bits A0 and A1, i.e., the address bits A2 to A16, are the same. For example, addresses #A0 to #A3 forming the amine address cycle are different from each other only in combination of the levels of the address bits A0 and A1.

Every time the address cycle is updated, the address transition detection signal/ATD is activated in a one-shot manner.

The address transition deflection signal/ATD is activated in response to the input of a new address #A0. In response to this, in each data block DB, sense amplifier circuits SA0a to SA7a read a read data group #SD0 corresponding to the address #A0, and sense amplifier circuits SA0b to SA7b read a read data group #SD1 corresponding to the address #A1. Moreover, sense amplifier circuits SA0c to SA7c read a read data group #SD2 corresponding to the address #A2, and sense amplifier circuits SA0d to SA7d read a read data group #SD3 corresponding to the address #A3.

Multiplexers MX0 to MX7 transmit one of the read data groups #SD0 to #SD3 to output buffer 70 according to internal address bits a0 and a1 respectively corresponding to the address bits A0 and A1. Therefore, output data groups #D0 to #D3 respectively corresponding to the addresses #A0 to #A3 can be successively output in response to the change in address. The page-mode reading is conducted similarly in the following address cycle formed by addresses #A4 to #A7.

Thus, in each data block DB, four sense amplifier circuits respectively corresponding to the sub data blocks are operated in parallel, so that the data corresponding to the four internal addresses of the same address cycle are read in parallel. Therefore, the data output (corresponding to the output of the data groups #D1, #D2, #D3, #D5, #D6, #D7 in FIG. 21) in response to switching of the lower two address bits A0 and A1 can be conducted at a high speed. Accordingly, the rate of the data that is output by the rapid access is increased as compared to semiconductor memory device 110 for conducting the 2-byte/page page-mode reading, whereby the overall data reading speed of semiconductor memory device 120 can further be increased.

The number of sense amplifiers to be operated simultaneously and the number of bit lines to be coupled to the sense amplifier circuits are four times those of semiconductor memory device 100 shown in FIG. 16. Therefore, the 4-byte/page page-mode reading is conducted with increased current consumption. More specifically, the charging current is increased to 4·Ich, and the memory cell current is increased to 4·Ice. Thus, although the page-mode operation increases the data reading speed, it also increases the current consumption.

As described above, the page-mode reading increases the data reading speed by increasing the number of addresses successively input within the same address cycle. However, this correspondingly increases the number of sense amplifier circuits, resulting in an increased layout area. Moreover, the number of sense amplifier circuits to be operated simultaneously and the number of bit lines to be coupled to the sense amplifier circuits in the data read operation are also increased. Therefore, the increased data reading speed correspondingly increases the current consumption.

SUMMARY OF THE INVENTION

It is an object of the present invention to reduce the current consumption and the layout area in a semiconductor memory device for conducting the page mode reading.

In summary, according to the present invention, a semiconductor memory device for conducting data output in response to K addresses from first to Kth addresses having at least one bit in common (where K is a natural number; K≧2) includes a data block, a plurality of sense amplifier circuits, a first data selection circuit, a second data selection circuit, a decode circuit, and a third data selection circuit.

The data block has a plurality of memory cells arranged in a matrix, and is divided into N sub data blocks (where N is a natural number; N≧2). The plurality of sense amplifier circuits are provided corresponding to the respective sub data blocks, and amplify the read data transmitted thereto. N first data selection circuits and N second data selection circuits are provided corresponding to the respective sub data blocks. Each of the first data selection circuits selects L read data from a corresponding one of the N sub data blocks according to at least one bit of the addresses, and outputs the selected L read data (where L is a natural number given by K/N). Each of the second data selection circuits selects one of the L read data from a corresponding one of the N first data selection circuits, and transmits the selected read data to a corresponding one of the N sense amplifier circuits. The decode circuit switches selection of the read data in the N second data selection circuits according to the addresses. The third data selection circuit is provided corresponding to the data block, and receives the N read data respectively amplified by the N sense amplifier circuits, and selectively outputs the read data corresponding to the addresses.

Accordingly, the present invention is mainly advantageous in that the page-mode reading can be conducted in which a larger number of addresses than that of sense amplifier circuits are successively accessed. As a result, high-speed page-mode reading can be conducted with reduced power consumption and layout area of the sense amplifier circuits.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention are described with reference to the accompanying drawings.

Figure 1:
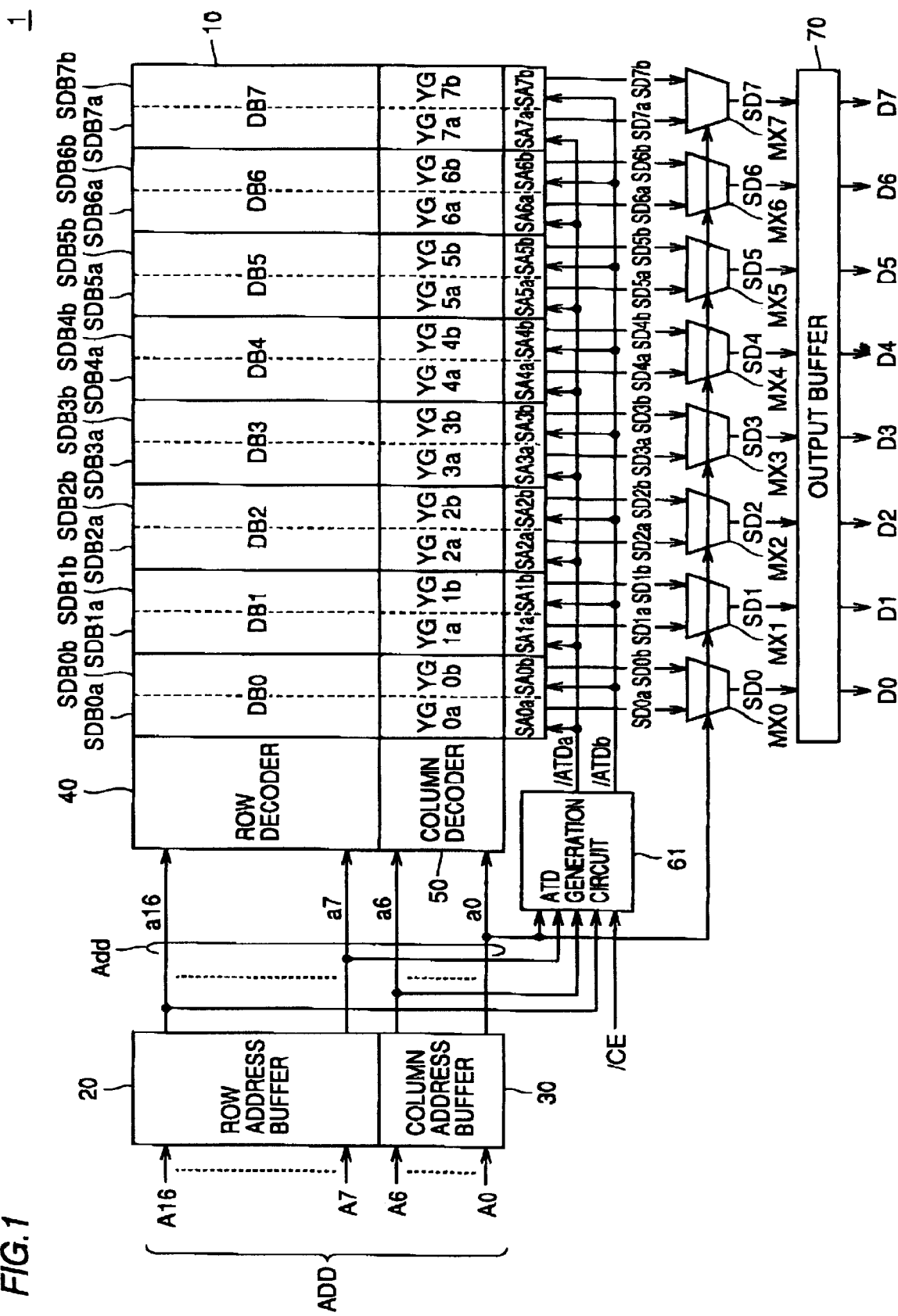
FIG. 1 is a schematic block diagram showing the structure associated with the read operation of a semiconductor memory device 1 according to one embodiment of the present invention.

Referring to FIG. 1, a semiconductor memory device 1 according to one embodiment of the present invention includes a memory cell array 10 having a plurality of memory cells arranged in a matrix. In memory cell array 10, word lines WL and bit lines BL are provided corresponding to the respective memory cell rows and columns (not shown). Note that the present embodiment is described for the case where semiconductor memory device 1 is a flash memory.

Memory cell array 10 is divided into data blocks DB0 to DB7. Like conventional semiconductor memory device 110 for conducting the 2-byte/page page-mode reading, each data block DB0 to DB7 is divided into two sub data blocks. For example, data block DB0 is divided into sub data blocks SDB0a and SDB0b. Note that three sense amplifier circuits or more may be provided for each data block. However, as can be seen from the following description, the present invention outputs the data from each data block by sequentially selecting one of a plurality of sense amplifier circuits. Therefore, two sense amplifier circuits per data block are sufficient.

Semiconductor memory device 1 further includes sense amplifier circuits SA0a, SA0b to SA7a, SA7b provided corresponding to the respective sub data blocks SDB0a, SDB0b to SDB7a, SDB7b, multiplexers MX0 to MX7 provided corresponding to the respective data blocks DB0 to DB7, an ATD generation circuit 61 for detecting address transition, and an output buffer 70.

Semiconductor memory device 1 further includes a row address buffer 20 receiving address bits A7 to A16 of an address signal Add which are used for memory cell row selection, and a column address buffer 30 receiving address bits A0 to A6 of the address signal Add which are used for memory cell column selection. Row address buffer 20 and column address buffer 30 produce internal address bits a0 to a16 forming an internal address signal Add, which correspond to the respective address bits A0 to A16. Note that the number of bits of the address signal and the internal address signal, and the respective numbers of address bits transmitted to row address buffer 20 and column address buffer 30 are by way of example only, and the present invention can be applied regardless of the above-mentioned numbers of bits.

Semiconductor memory device 1 further includes a row decoder 40 for conducting row selection in memory cell array 10 according to the internal address bits a7 to a16, and a column decoder 50 for conducting column selection in memory cell array 10 according to the internal address bits a0 to a6.

ATD generation circuit 61 receives a cycle enable signal/CE and internal address bits a0 to a16, and produces address transition detection signals /ATDa and /ATDb. The cycle enable signal/CE is activated in response to the start of a new address cycle.

Sense amplifier circuits SA0a, SA1a, . . . SA7a conduct a new data read operation in response to the address transition detection signal/ATDa. Sense amplifier circuits SA0b, SA1b, . . . SA7b conduct a new data read operation in response to the address transition detection signal/ATDb. Each of sense amplifier circuits SA0a, SA0b to SA7a, SA7b is coupled to a single bit line of the corresponding sub data block SDB according to the column selection by column decoder 50, and outputs respective read data SD0a, SD0b to SD7a, SD7b.

Each multiplexer MX0 to MX7 receives the read data output from the two sense amplifier circuits of the corresponding data block DB, and selects one of the received read data according to the internal address bit a0, thereby outputting respective read data SD0 to SD7.

Output buffer 70 buffers the read data SD0 to SD7 respectively output from multiplexers MX0 to MX7, and outputs the data to the outside of semiconductor memory device 1 as output data D0 to D7.

Hereinafter, column selection of semiconductor memory device 1 is described with reference to FIG. 2A. Since column selection in each data block DB is conducted similarly, FIG. 2A exemplarily shows the structure associated with the column selection in data block DB0.

Column decoder 50 selectively activates one of k column selection signals Y4 to Yk+3 used for k:1 column selection, according to the internal address bits a2 to a6.

In each sub data block SDB0a, SDB0b, L sets of k bit lines BL0 to BLk−1 selected according to the internal address bits a2 to a6 are provided (where L is a natural number). L is given by K/N, where K is a number of addresses included in the same address cycle and N is a number of sub data blocks included in each data block. FIG. 2A exemplarily shows the structure of L=2(K=4, N=2). Accordingly, a total of 2·k (=L·k) bit lines BL are provided in each sub data block SDB0a, SDB0b.

A column selection circuit YG0a includes a first sub column selection circuit YG0aU for conducting column selection according to the upper internal address bits a2 to a6, and a second sub column selection circuit YG0aL for conducting column selection according to the lower internal address bits a0 and a1. Similarly, a column selection circuit YG0b includes a first sub column selection circuit YG0bU and a second sub column selection circuit YG0bL.

Each of first sub column selection circuits YG0aU and YG0bU has a plurality of column selection switches that are turned ON in response to activation of the respective column selection signals Y4 to Yk+3, and conducts selection of the read data according to the upper internal address bits a2 to a6 by selecting the L bit lines (L=2) in the corresponding sub data block SDB0.

Second sub column selection circuit YG0aL is provided between first sub column selection circuit YG0aU and sense amplifier circuit SA0a, and connects one of the two (=L) bit lines selected by first sub column selection circuit YG0aU to sense amplifier circuit SA0a according to a column selection signal Y0, Y2.

Second sub column selection circuit YG0bL is provided between first sub column selection circuit YG0bU and sense amplifier circuit SA0b, and connects one of the two (=L) bit lines selected by first sub column selection circuit YG0bU to sense amplifier circuit SA0b according to a column selection signal Y1, Y3. Second sub column selection circuits YG0aL and YG0bL conduct selection of the read data according to the internal address bits a0 and a1 corresponding to the lower address bits A0 and A1.

As described later in detail, column decoder 50 controls activation of the column selection signals Y0 to Y3 according to the internal address bits a0 and a1.

In response to respective address transition detection signals /ATDa and /ATDb, sense amplifier circuits SA0a and SA0b conduct a new data read operation based on the change in voltage on the corresponding bit line BL selectively coupled thereto through the respective column selection circuits YG0a and YG0b. Sense amplifier circuits SA0a and SA0b respectively output the read data SD0a and SD0b.

Figure 2A:
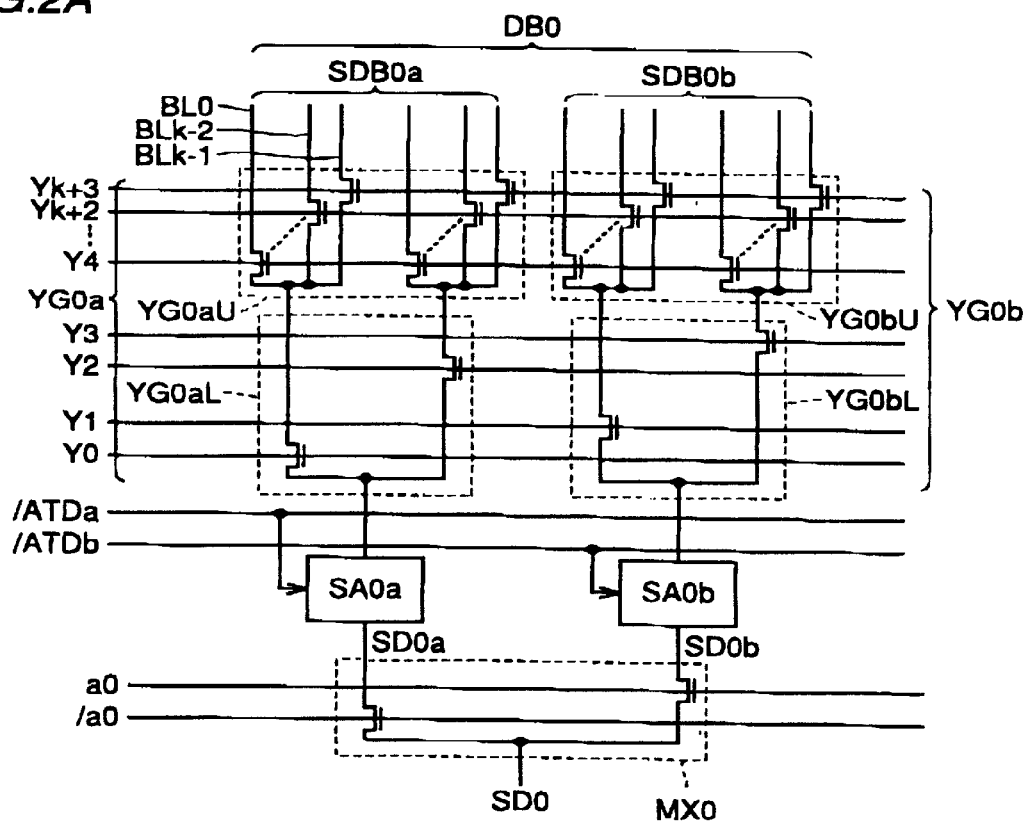
FIG. 2A is a diagram illustrating an example of the structure of circuits associating with column selection in semiconductor memory device 1 shown in FIG. 1.
Figure 2B:
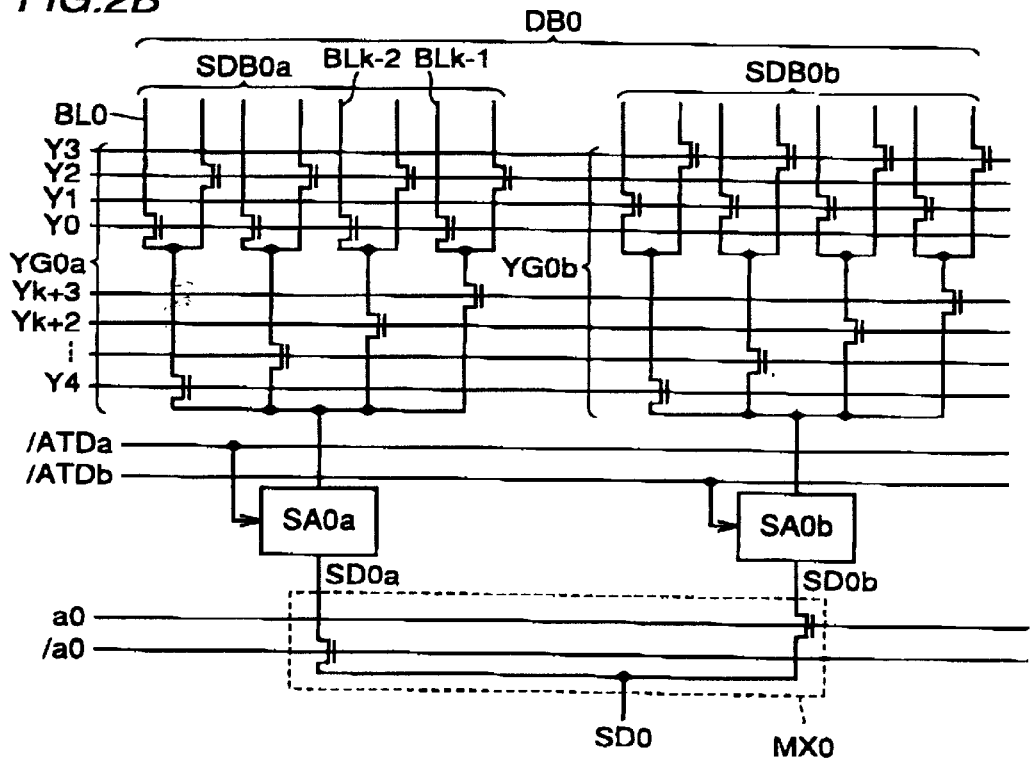
FIG. 2B is a diagram illustrating an another example of the structure of circuits associating with column selection in semiconductor memory device 1 shown in FIG. 1.

As shown in FIG. 2B, an arrangement of first sub column selection circuits YG0aU and YG0bU and second sub columns selection circuits YG0aL and YG0bL are interchangeable, respectively. In a configuration of FIG. 2B, contrary to a configuration of FIG. 2A, the selection of read data according to the lower address bits a0 and a1 is performed prior to the selection according to the upper address bits a2–a6.

Even in the configuration of FIG. 2B, an outputting of the read data selected in a manner similar to that of FIG. 2A to sense amplifier circuits SA0a and SA0b is possible.

Hereinafter, the structure of the sense amplifier circuitry is described. Since each sense amplifier circuit has the same structure, FIG. 3 exemplarily shows the structure of sense amplifier circuit SA0a.

Figure 3:
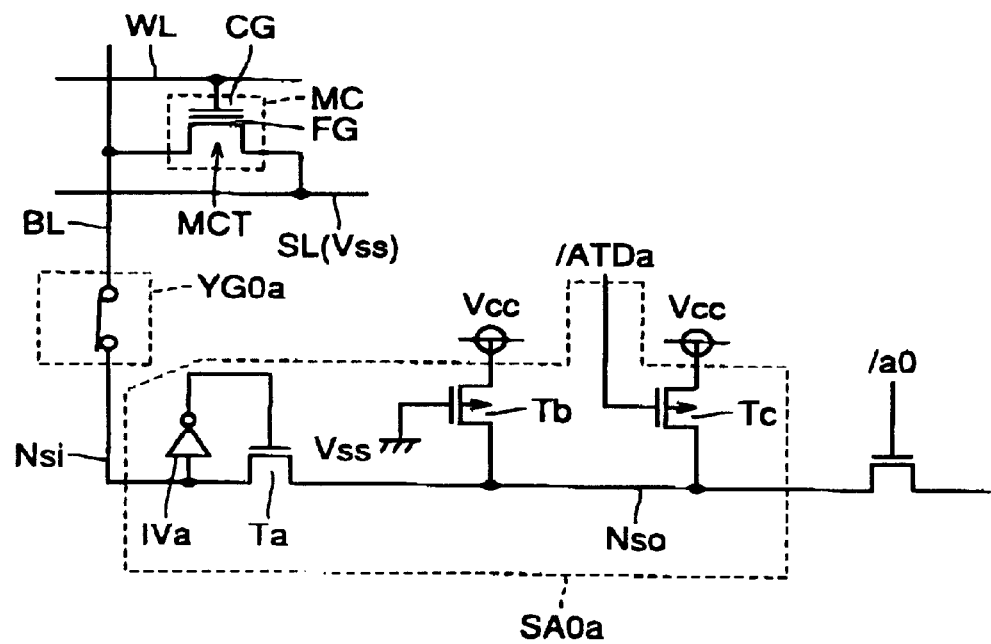
FIG. 3 is a circuit diagram showing the structure of a sense amplifier circuit.

Referring to FIG. 3, a memory cell MC is coupled to sense amplifier circuit SA0a through a single bit line BL selected by column selection circuit YG0a. Memory cell MC is provided at each intersection of the word line WL and the bit line BL, and has a memory cell transistor MCT electrically coupled between the bit line BL and a source line SL. Memory cell transistor MCT has a control gate CG coupled to the word line WL.

Memory cell MC has a floating gate FG. In writing the H-level data, electrons are injected into floating gate FG. When the electrons are injected, the threshold voltage of memory cell transistor MCT in terms of control gate CG is increased. In this way, the threshold voltage of memory cell transistor MCT is changed depending on whether the electrons are injected into floating gate FG or not. Thus, the data stored in memory cell MC in a non-volatile manner can be read by sensing whether memory cell transistor MCT is turned ON or OFF upon activation of the word line WL.

Sense amplifier circuit SA0a has an N-type MOS transistor Ta electrically coupled between a sense amplifier input node Nsi and a sense amplifier output node Nso, a P-type MOS transistor Tb used as a pull-up resistance for sense amplifier output node Nso, a P-type MOS transistor Tc for precharging sense amplifier output node Nso in response to the address transition detection signal /ATDa, and an inverter IVa coupled between sense amplifier input node Nsi and the gate of transistor Ta.

Transistor Tc couples the power supply voltage Vcc to sense amplifier output node Nso in response to activation (L level) of the address transition detection signal /ATDa. The gate voltage of P-type MOS transistor Tb is coupled to the ground voltage Vss. However, transistor Tb is designed to have less power-driving capability than that of precharging transistor Tc. Therefore, transistor Tb is used as a pull-up resistance for constantly supplying a very small current to sense amplifier output node Nso.

Hereinafter, the data read operation in the sense amplifier circuitry is described.

When the address transition detection signal /ATDa is activated (L level), transistor Tc is turned ON to precharge sense amplifier output node Nso to the power supply voltage Vcc. The address transition detection signal /ATDa is inactivated (H level) a prescribed time after the precharging is completed, whereby transistor Tc is turned OFF.

Memory cell MC, which is selected by the internal address signal Add according to activation (H level) of the word line WL and selection of column selection circuit YG0a, is coupled to sense amplifier input node Nsi through the bit line BL. In the case where the H-level data has been written to memory cell MC, memory cell transistor MCT is not turned ON even if the word line WL is activated to H level. Accordingly, the voltage level of the bit line BL, i.e., the voltage level of sense amplifier input node Nsi, does not change. Therefore, the output of inverter IVa is set to L level, and transistor Ta is maintained in the OFF state. As a result, the voltage level of sense amplifier output node Nso is set to the power supply voltage Vcc.

In the case where the H-level data has not been written to memory cell MC, a current path between sense amplifier input node Nsi and source line SL (ground voltage Vss) through memory cell MC is formed via the bit line BL and column selection circuit YG0a in response to activation of the word line WL to H level. As a result, the voltage level of sense amplifier input node Nsi is reduced.

When the voltage level of sense amplifier input node Nsi falls by a prescribed amount or more, the output of inverter IVa changes from L level to H level, whereby transistor Ta is turned ON. In response to this, a current path is formed between sense amplifier output node Nso and ground voltage Vss through memory cell MC. Thus, the voltage level of sense amplifier output node Nso is reduced, whereby the L-level data is read.

Referring back to FIG. 2A, multiplexer MX0 has a plurality of column selection switches coupled between the output buffer 70 and the respective sense amplifier circuits SA0a and SA0d and operating in response to the internal address bit a0 and an inverted signal /a0 thereof, respectively. Accordingly, multiplexer MX0 transmits one of the read data SD0a and SD0b that corresponds to the address signal Add to output buffer 70 as read data SD0 from data block DB0.

Multiplexer MX conducts data selection according to the least significant internal address bit a0.

Figure 4:
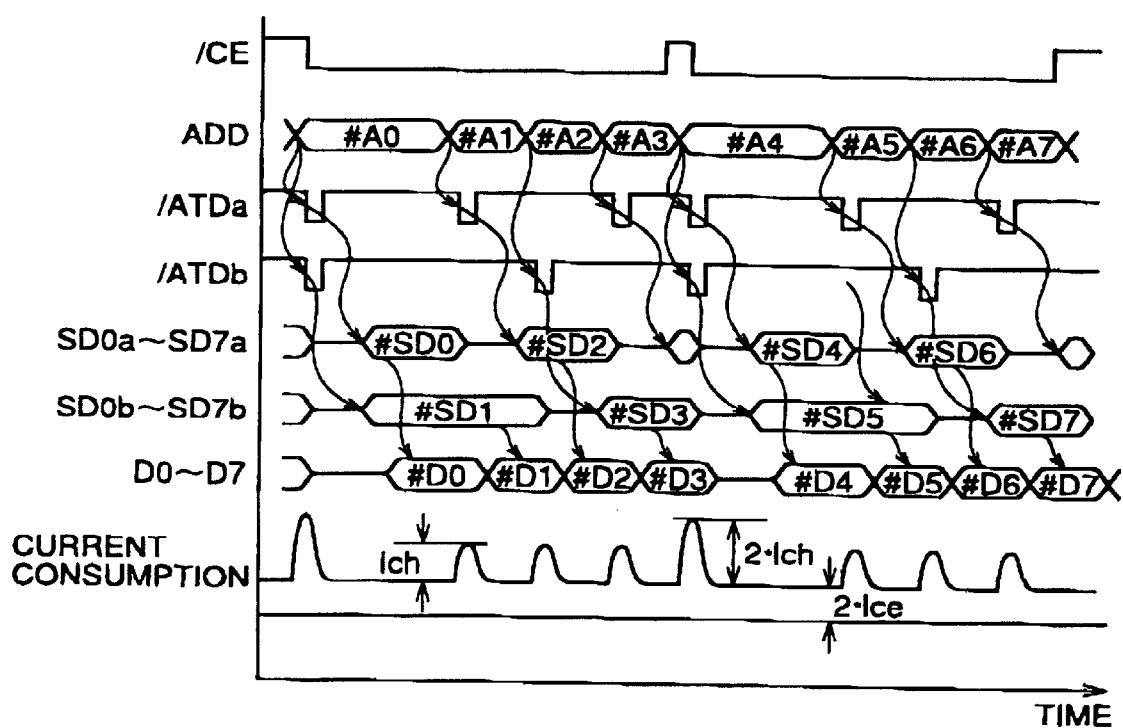
FIG. 4 is a timing chart illustrating the read operation of semiconductor memory device 1 shown in FIG. 1.

Referring to FIG. 4, in semiconductor memory device 1, four address signals ADD, which are different from each other in the lower two bits A0 and A1 of their address bits, are successively input within the same address cycle, as in the case of the 4-byte/page page-mode operation.

The cycle enable signal /CE is activated to L level in response to the start of a new address cycle. The cycle enable signal /CE is maintained in the active state (L level) during the same address cycle. The cycle enable signal /CE is inactivated to H level when the address cycle is terminated.

Figure 24:
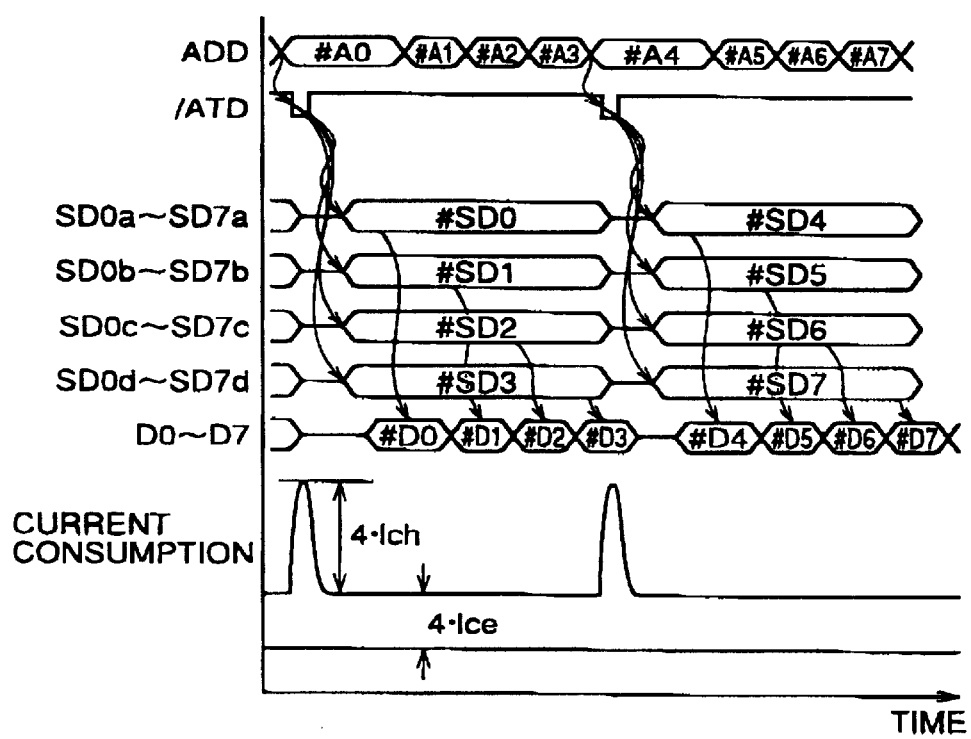
FIG. 24 is a timing chart illustrating the read operation of semiconductor memory device 120 shown in FIG. 22.

As in the case of FIG. 24, the address bits A0 and A1 contained in the four address signals of the same address cycle change in the following order: (A0, A1)=(0, 0), (0, 1), (1, 0) and (1, 1). Accordingly, in the same address cycle, the address bits except for the lower two bits A0 and A1, i.e., the address bits A2 to A16, are the same.

In response to the start of a new address cycle, ATD generation circuit 61 activates each of the address transition detection signals/ATDa and /ATDb to L level for a prescribed period as one-shot pulse. During the same address cycle, ATD generation circuit 61 alternately activates one of the address transition detection signals/ATDa and /ATDb to L level upon each transition of the internal address in response to the change in level of the internal address bit a0 corresponding to the least significant address bit A0.

In response to the input of an address #A0 corresponding to the start of a new address cycle, the address transition detection signals/ATDa and /ATDb are activated. In response to this, in each data block DB, sense amplifier circuits SA0a to SA7a read a read data group #SD0 corresponding to the address #A0, and sense amplifier circuits SA0b to SA7b read a read data group #SD1 corresponding to an address #A1.

Multiplexers MX0 to MX7 select the read data group #SD0 for transmission to output buffer 70. As a result, the data group #D0 corresponding to the address #A0 is output from semiconductor memory device 1 as output data D0 to D7.

When the address changes from #A0 to #A1, data selection in multiplexers MX0 to MX7 is switched, so that the read data group #SD1 from sense amplifier circuits SA0b to SA7b are transmitted to output buffer 70. As a result, the data group #D1 corresponding to the address #A1 is output from semiconductor memory device 1.

In response to the transition of the address signal Add from address #A0 to #A1, ATD generation circuit 61 activates only the address transition detection signal/ATDa. The address transition detection signal/ATDb is not activated. Thus, sense amplifier circuits SA0a to SA7a conduct precharging for a new data read operation.

When the address changes from #A1 to #A2, ATD generation circuit 61 activates only the address transition detection signal/ATDb. In each data block DB, sense amplifier circuits SA0a to SA7a read a read data group #SD2 corresponding to the address #A2. Moreover, data selection in multiplexers MX0 to MX7 is switched, so that the read data group #SD2 from sense amplifier circuits SA0a to SA7a is transmitted to output buffer 70. As a result, the data group #D2 corresponding to the address #A2 is output from semiconductor memory device 1 as output data D0 to D7. Moreover, in response to activation of the address transition detection signal/ATDb, sense amplifier circuits SA0b to SA7b conduct precharging for a new data read operation.

When the address changes from #A2 to #A3, ATD generation circuit 61 activates only the address transition detection signal/ATDa. In each data block DB, sense amplifier circuits SA0b to SA7b read a read data group #SD3 corresponding to the address #A3. Moreover, data selection in multiplexers MX0 to MX7 is switched, so that the read data group #SD3 from sense amplifier circuits SA0b to SA7b is transmitted to output buffer 70. As a result, the data group #D3 corresponding to the address #A3 is output from semiconductor memory device 1 as output data D0 to D7. Sense amplifier circuits SA0a to SA7a conduct precharging in response to activation of the address transition detection signal/ATDa.

When the data corresponding to the address #A3 has been read, the address cycle of the addresses #A0 to #A3 is terminated. Therefore, the cycle enable signal/CE is inactivated to H level.

When a new address cycle according to the input of an address #A4 is started, the cycle enable signal/CE is again activated to L level. In the addresses #A4 to #A7 as well, the lower two address bits A0 and A1 change similarly. Since the page-mode reading is conducted similarly in the address cycle of the addresses #A4 to A7, specific description thereof is omitted.

Thus, in semiconductor memory device 1, a plurality (L in number) of data are read by each of first sub column selection circuits YG0aU and YG0bU in each data block, whereby a plurality (K in number) of read data of the same address cycle can be pre-selected at the start of the address cycle. As a result, the data read operation can be conducted at a speed corresponding to that of the 4-byte/page page-mode reading shown in FIG. 24, while division of the sub data blocks SDB and arrangement of the sense amplifier circuits are equivalent to those of semiconductor memory device 110 for conducting the 2-byte/page page-mode reading shown in FIG. 19.

Hereinafter, the current consumption of semiconductor memory device 1 is considered. At the start of the address cycle (e.g., address #A0), the sense amplifier circuits corresponding to the respective sub data blocks conduct the data read operation in parallel. Therefore, the bit-line charging current is given by 2·Ich. In the data reading operation corresponding to the following address input (e.g., #A1 to #A3), a single sense amplifier circuit operates in each data block. Therefore, the bit-line charging current is given by Ich. The stationary current is given by 219 Ice according to the number of sense amplifier circuits.

Figure 19:
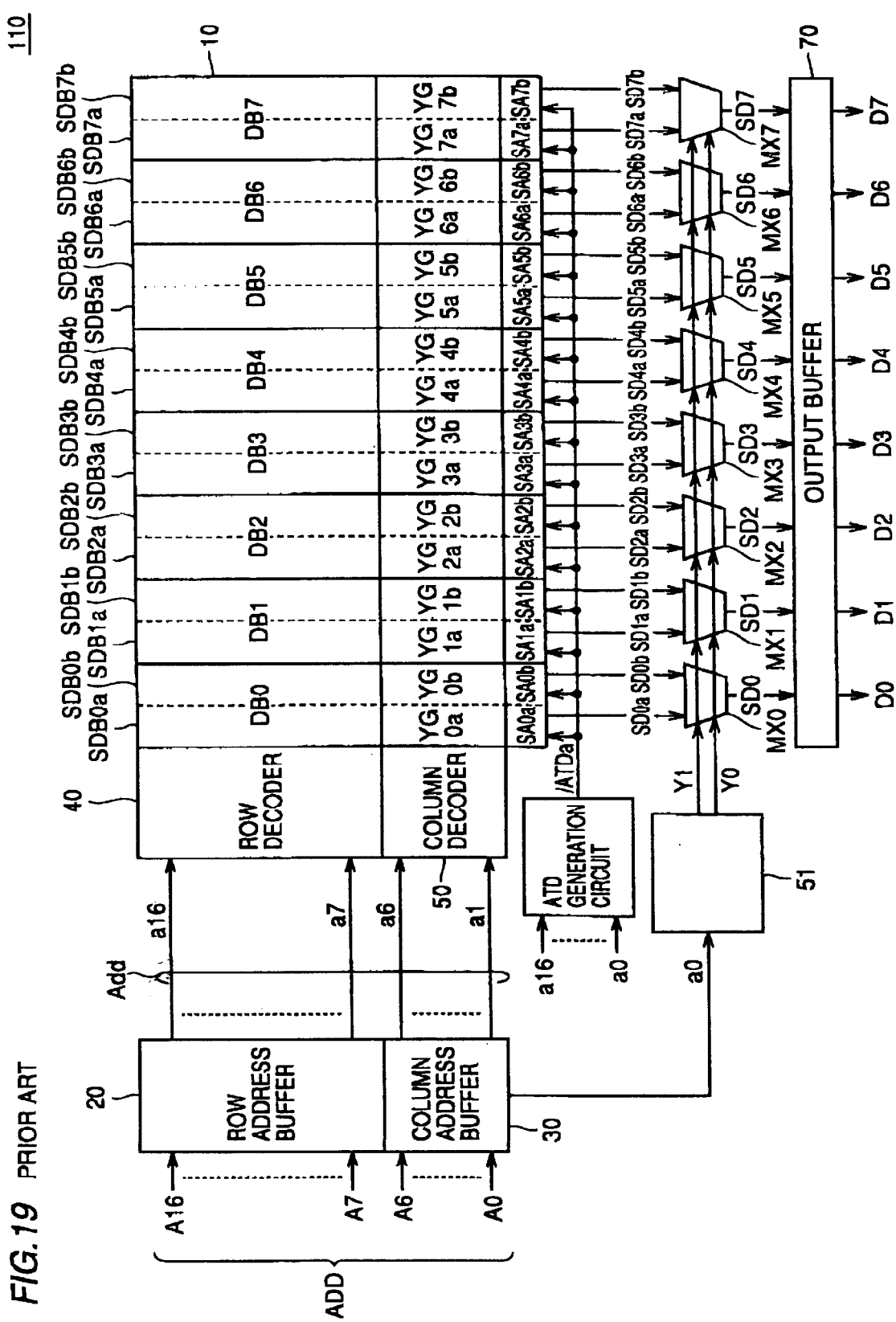
FIG. 19 is a schematic block diagram showing the structure associated with the read operation of a conventional semiconductor memory device 110 for conducting the page-mode reading at 2 bytes/page.
Figure 20:
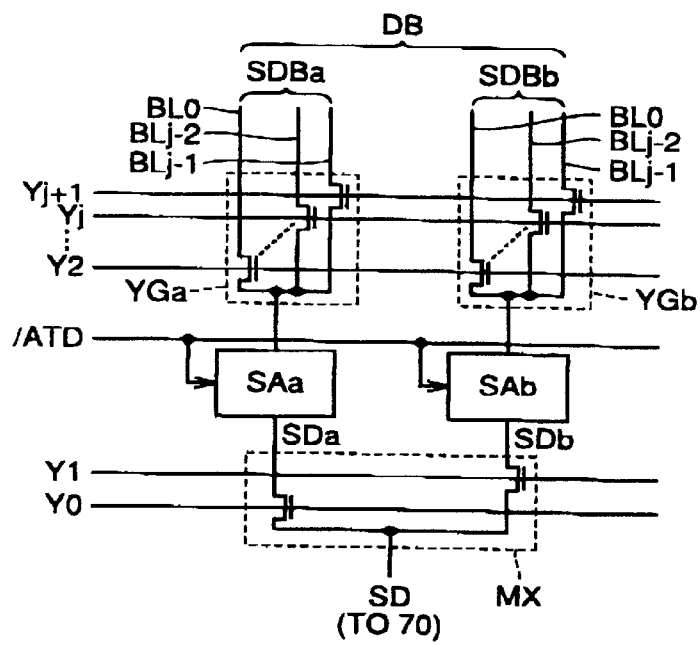
FIG. 20 is a diagram illustrating column selection in semiconductor memory device 110 shown in FIG. 19.
Figure 21:
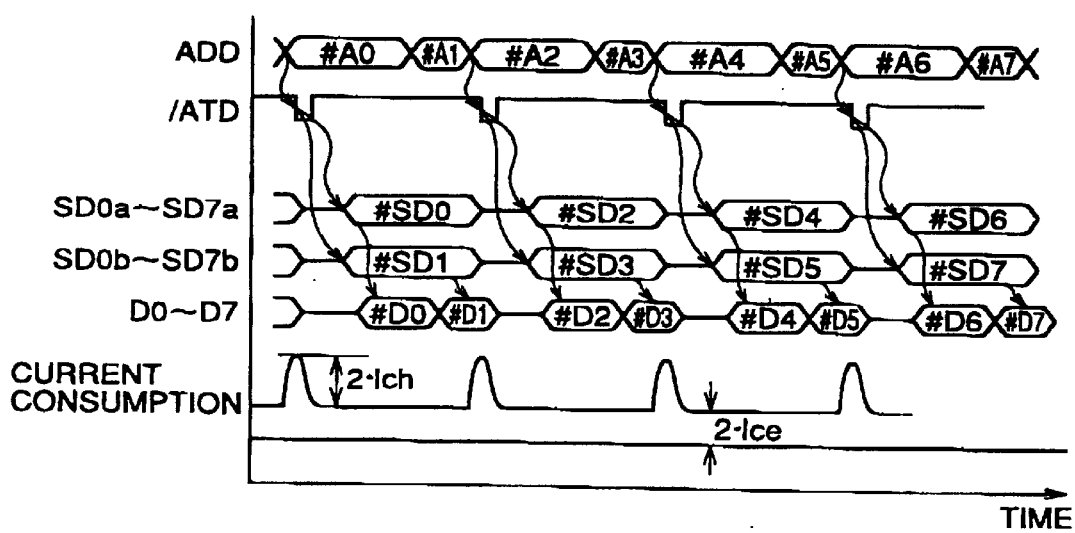
FIG. 21 is a timing chart illustrating the read operation of semiconductor memory device 110 shown in FIG. 19.
Figure 22:
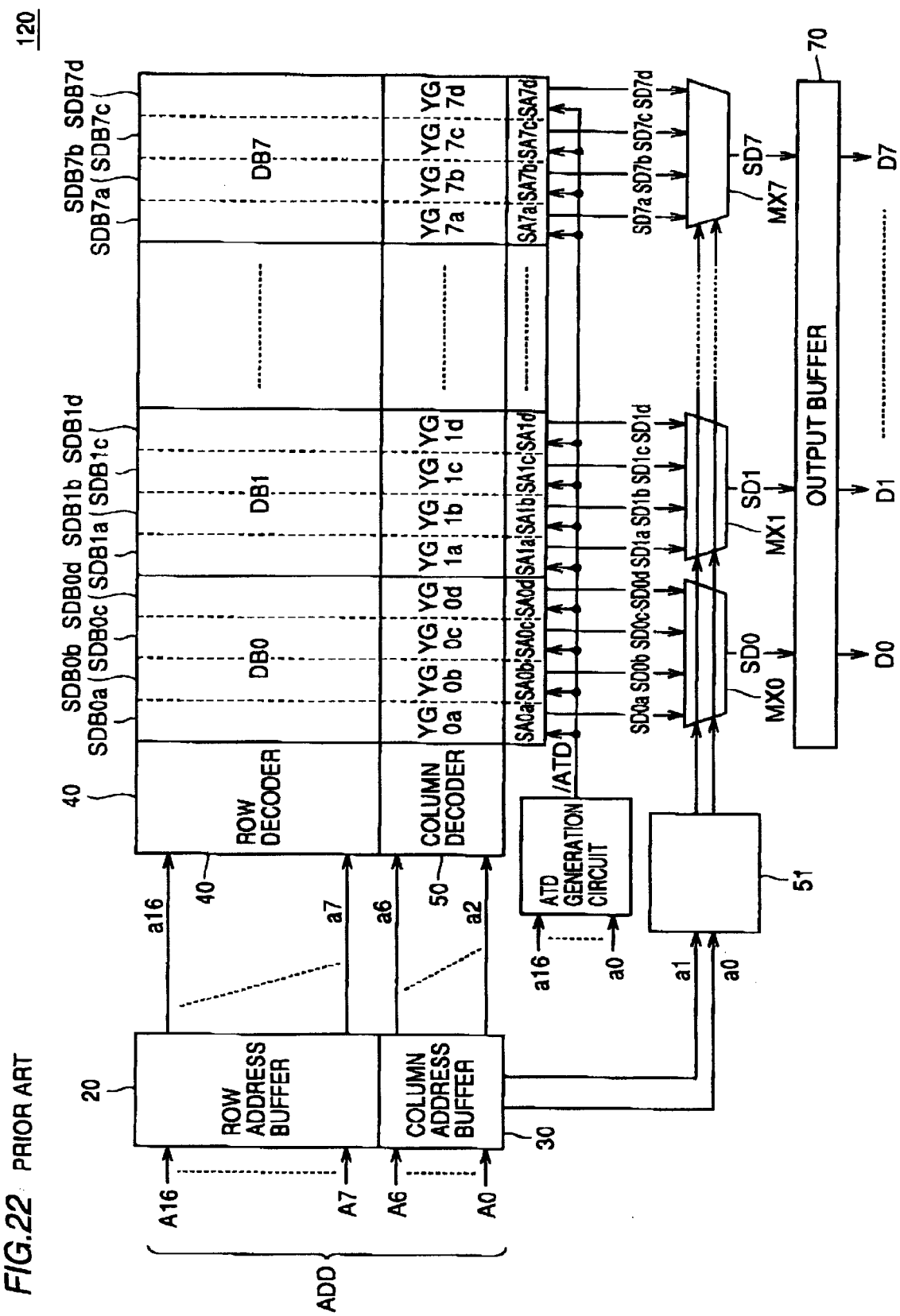
FIG. 22 is a schematic block diagram illustrating the structure associated with the read operation of a semiconductor memory device 120 for conducting the page-mode reading at 4 bytes/page.
Figure 23:
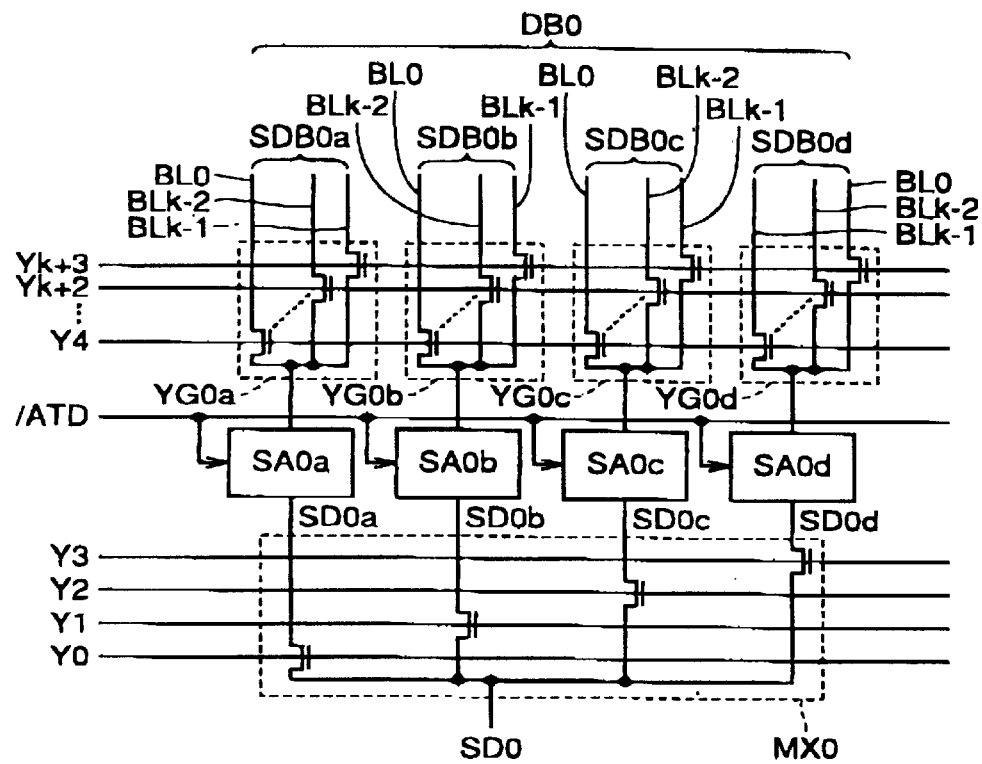
FIG. 23 is a diagram illustrating column selection in semiconductor memory device 120 shown in FIG. 22.

Accordingly, semiconductor memory device 1 can reduce the current consumption to the level approximately equivalent to that of the 2-byte/page page-mode reading shown in FIG. 19, while increasing the data reading speed to the value equivalent to that of the 4-byte/page page-mode reading shown in FIG. 22.

Hereinafter, the specific structure of the circuitry involved in the column selection in semiconductor memory device 1 is described.

Figure 5:
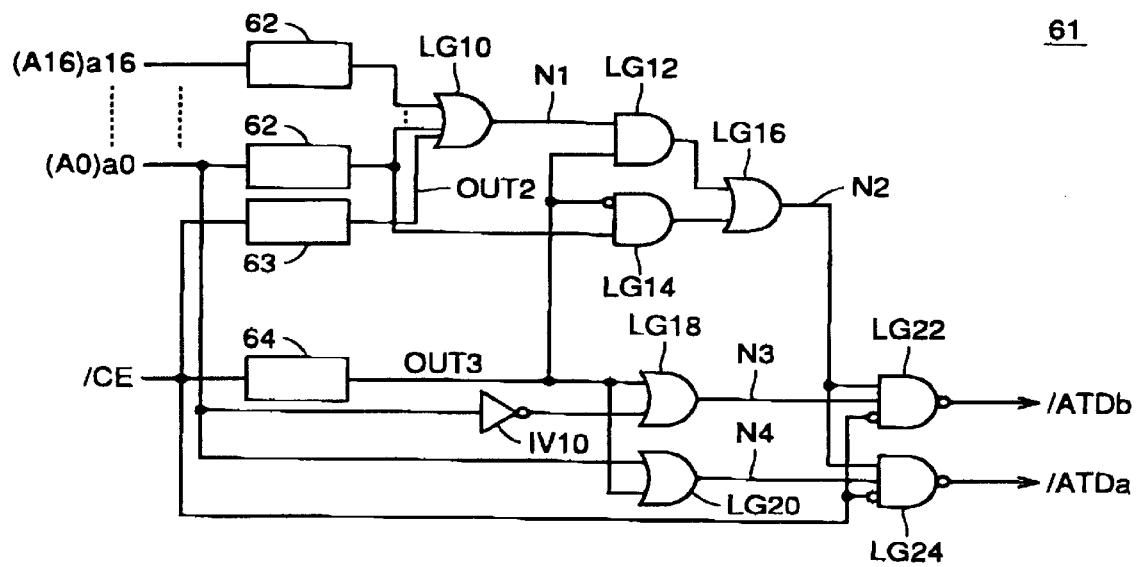
FIG. 5 is a circuit diagram showing the structure of an ATD generation circuit 61.

Referring to FIG. 5, ATD generation circuit 61 includes one-shot pulse producing circuits 62 provided corresponding to the respective internal address bits a0 to a16, and one-shot pulse producing circuits 63 and 64 responsive to the cycle enable signal/CE.

Figure 6:
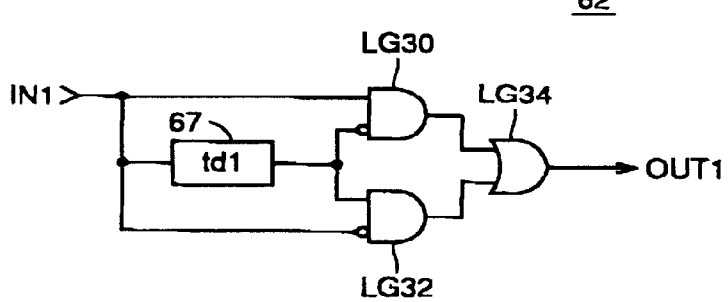
FIG. 6 is a circuit diagram showing the structure of a one-shot pulse producing circuit 62.

Referring to FIG. 6, one-shot pulse producing circuit 62 has a delay circuit 67 for outputting an input signal IN1 corresponding to one of the internal address bits a0 to a16 with a delay time td1, a logic gate LG30 for outputting the AND-operation result of the input signal IN1 and the inverted signal of the output of delay circuit 67, a logic gate LG32 for outputting the AND-operation result of the inverted signal of the input signal IN1 and the output signal of delay circuit 67, and a logic gate LG34 for outputting the OR-operation result of the respective outputs of logic gates LG30 and LG32 as one-shot pulse OUT1.

Figure 7:
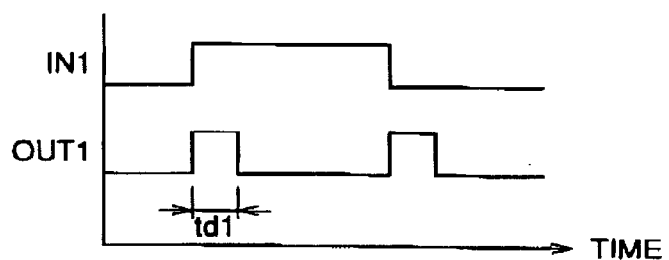
FIG. 7 is a timing chart illustrating the operation of one-shot pulse producing circuit 62.

Referring to FIG. 7, one-shot pulse producing circuit 62 outputs the one-shot pulse OUT1 activated to H level for a prescribed period td1 in response to the change in level of the input signal IN1.

Figure 8:
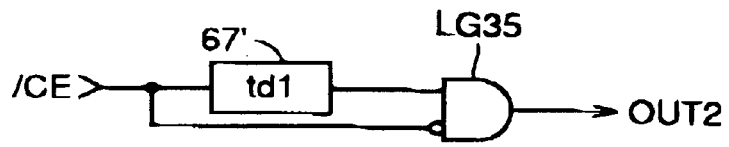
FIG. 8 is a circuit diagram showing the structure of a one-shot pulse producing circuit 63.

Referring to FIG. 8, one-shot pulse producing circuit 63 has a delay circuit 67' for outputting the cycle enable signal/CE with the delay time td1, and a logic gate LG35 for outputting the AND-operation result of the output signal of delay circuit 67' and the inverted signal of the cycle enable signal/CE.

Figure 9:
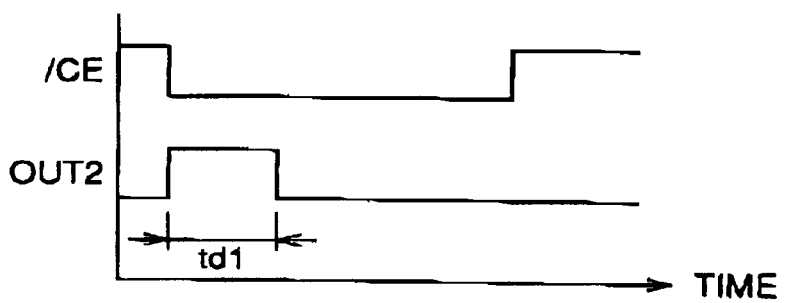
FIG. 9 is a timing chart illustrating the operation of one-shot pulse producing circuit 63.

Referring to FIG. 9, one-shot pulse producing circuit 63 outputs a one-shot pulse OUT2 activated to H level for the prescribed period td1 in response to activation (to L level) of the cycle enable signal/CE.

Figure 10:
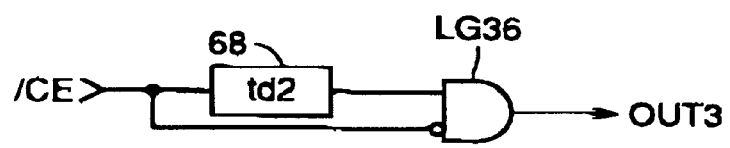
FIG. 10 is a circuit diagram showing the structure of a one-shot pulse producing circuit 64.

Referring to FIG. 10, one-shot pulse producing circuit 64 has a delay circuit 68 for outputting the cycle enable signal/CE with a delay time td2, and a logic gate LG36 for outputting the AND-operation result of the output of delay circuit 68 and the inverted signal of the cycle enable signal/CE as one-shot pulse OUT3.

Figure 11:
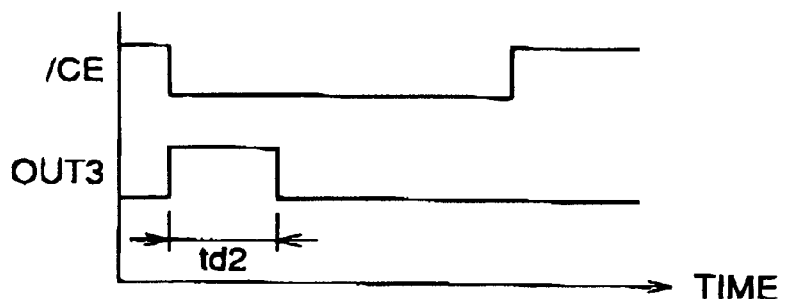
FIG. 11 is a timing chart illustrating the operation of one-shot pulse producing circuit 64.

Referring to FIG. 11, one-shot pulse producing circuit 64 outputs the one-shot pulse activated to H level for a prescribed period td2 in response to activation (to L level) of the cycle enable signal/CE. The one-shot pulse OUT3 is not activated upon inactivation (to H level) of the cycle enable signal/CE.

Referring back to FIG. 5, ATD generation circuit 61 has a logic gate LG10 for outputting to a node N1 the OR-operation result of the one-shot pulse OUT2 from one-shot pulse producing circuit 63 and the respective output signals OUT1 of one-shot pulse producing circuits 62 provided corresponding to the respective address bits, a logic gate LG12 for outputting the AND-operation result of the signal level at node N1 and the one-shot pulse 0OUT3 from one-shot pulse producing circuit 64, a logic gate LG14 for outputting the AND-operation result of the inverted signal of the one-shot pulse OUT3 and the output signal of one-shot pulse producing circuit 62 corresponding to the address bit A0, and a logic gate LG16 for outputting the OR-operation result of the respective outputs of logic gates LG12 and LG14.

ATD generation circuit 61 further has a logic gate LG18 for outputting to a node N3 the OR-operation result of the one-shot pulse OUT3 and the inverted signal/a0 of the internal address bit a0, a logic gate LG20 for outputtng to a node N4 the OR-operation result of the one-shot pulse OUT3 and the internal address bit a0, and logic gates LG22 and LG24 for outputting the address transition detection signals/ATDa and /ATDb, respectively.

Logic gate LG22 outputs as the address transition detection signal/ATDb the NAND-operation result of the following three inputs: the respective signal levels at nodes N2 and N3 and the inverted signal of the cycle enable signal/CE. Logic gate LG24 outputs as the address transition detection signal/ATDa the NAND-operation result of the following three inputs: the respective signal levels at nodes N2 and N4 and the inverted signal of the cycle enable signal/CE.

With such a structure, a one-shot pulse activated to H level is produced at node N1 when any one of the address bits A0 to A16 is changed in level or the cycle enable signal/CE is re-activated.

The signal level at node N3 is set to H level when the level of the internal address bit a0 is "0(L level)." The signal level at node N4 is set to H level when the level of the internal address bit a0 is "1(H level)." When the one-shot pulse OUT3 from one-shot pulse producing circuit 64 is activated to H level in response to activation of the cycle enable signal/CE, nodes N3 and N4 are both set to H level for the period td2 after the start of the new address cycle.

In the prescribed period td2 after activation of the cycle enable signal/CE, node N2 is set to H level according to the output of logic gate LG12. In the period during which the one-shot pulse OUT3 is at L level, node N2 is rendered at H level according to the output of logic gate L14.

Figure 12:
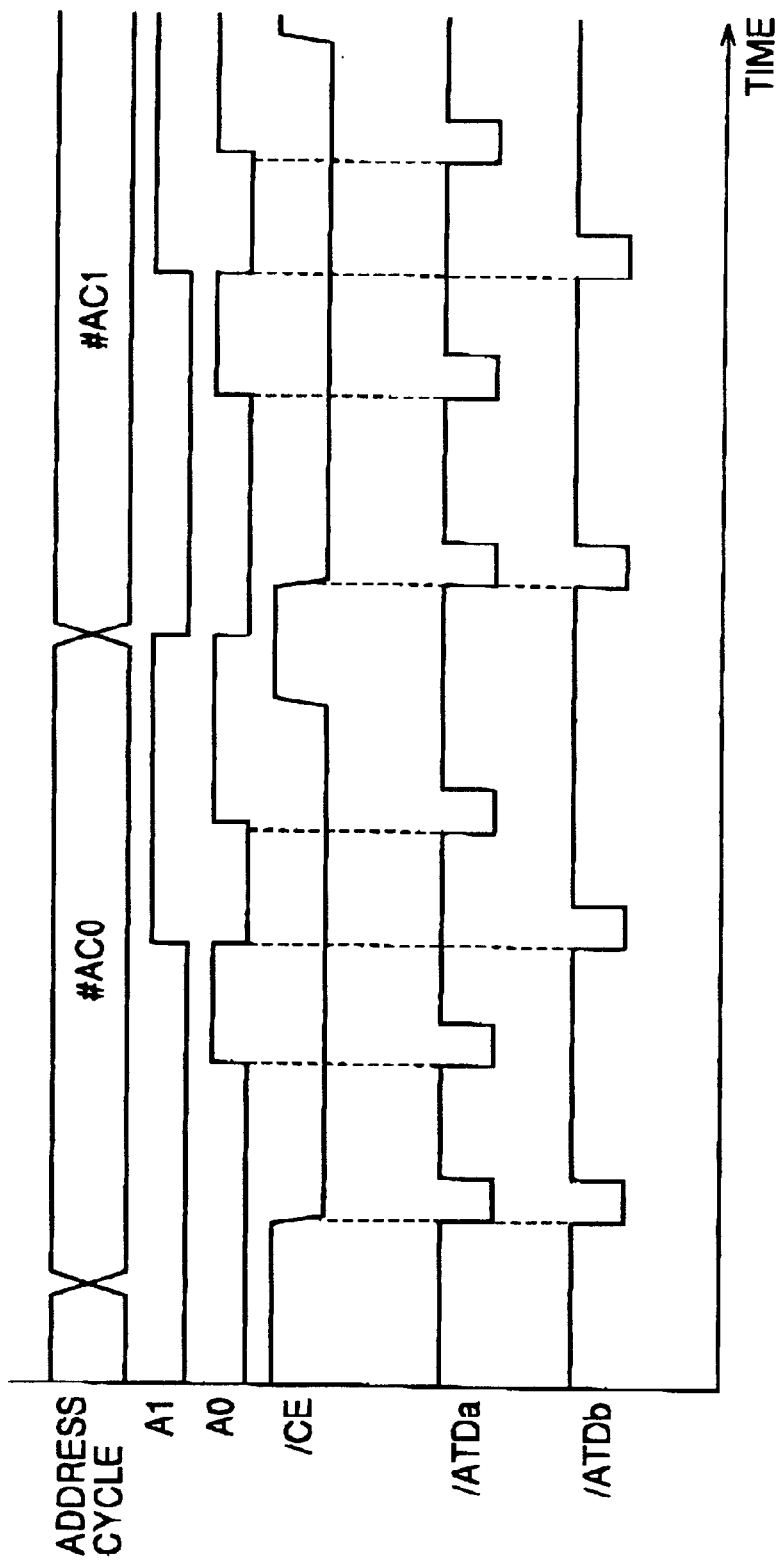
FIG. 12 is a timing chart illustrating the operation of ATD generation circuit 61.

Referring to FIG. 12, the cycle enable signal/CE is activated to L level in response to the start of a new address cycle. In the same address cycle, the address is switched according to the change in signal level of the lower two address bits A0 and A1. For example, in address cycle #AC0, four addresses are successively input according to the change in level of the address bits A0 and A1.

Since nodes N3 and N4 are both set to H level in response to activation of the cycle enable signal/CE, the address transition detection signals/ATDa and /ATDb are simultaneously activated.

At the time of the following address input in the sane address cycle, the one-shot pulse OUT3 has already been inactivated to L level. Therefore, one of nodes N3 and N4 is selectively set to H level according to the level of the address bit A0. In response to this, the address transition detection signals/ATDa and /ATDb are alternately activated one by one.

Hereinafter, production of the column selection signals Y0 to Y3 is described.

Figure 13:
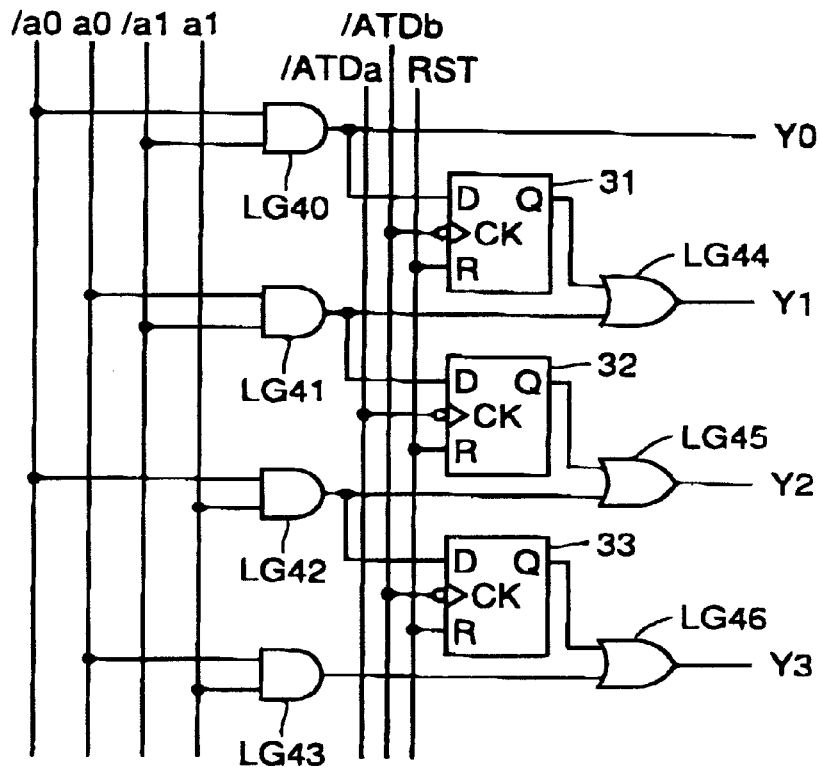
FIG. 13 is a block diagram illustrating the structure of a portion of a column decoder 50 for producing column selection signals Y0 to Y3 corresponding to the lower two bits A0 and A1 of address bits.

Referring to FIG. 13, column decoder 50 has a logic gate LG40 for outputting as the column selection signal Y0 the AND-operation result of the respective inverted signals/a0 and /a1 of the internal address bits a0 and a1, a logic gate LG41 for outputting the AND-operation result of the internal address bits a0 and /a1, a logic gate LG42 for outputting the AND-operation result of the internal address bits/a0 and a1, and a logic gate LG43 for outputting the AND-operation result of the internal address bits a0 and a1.

Column decoder 50 farther has flip-flops 31 and 33 operating in response to the address transition detection signal/ATDb, and a flip-flop 32 operating in response to the address transition detection signal/ATDa. Flip-flop 31, which operates in response to the falling edge of the address transition detection signal/ATDb, fetches the output of logic gate LG40, i.e., the column selection signal Y0, from the D terminal for output to the Q terminal. Flip-flop 32, which operates in response to the falling edge of the address transition detection signal/ATDa, fetches the output of logic gate LG41 from the D terminal for output to the Q terminal. Flip-flop 33, which operates in response to the falling edge of the address transition detection signal/ATDb, fetches the output of logic gate LG42 from the D terminal for output to the Q terminal.

Column decoder 50 further has a logic gate LG44 for outputting as the column selection signal Y1 the OR-operation result of the respective output signal levels of the Q terminal of flip-flop 31 and logic gate LG41, a logic gate LG45 for outputting as the column selection signal Y2 the OR-operation result of the respective output signal levels of the Q terminal of flip-flop 32 and logic gate LG42, and a logic gate LG46 for outputting as the column selection signal Y3 the OR-operation result of the respective output signal levels of the Q terminal of flip-flop 33 and logic gate LG43.

Figure 14:
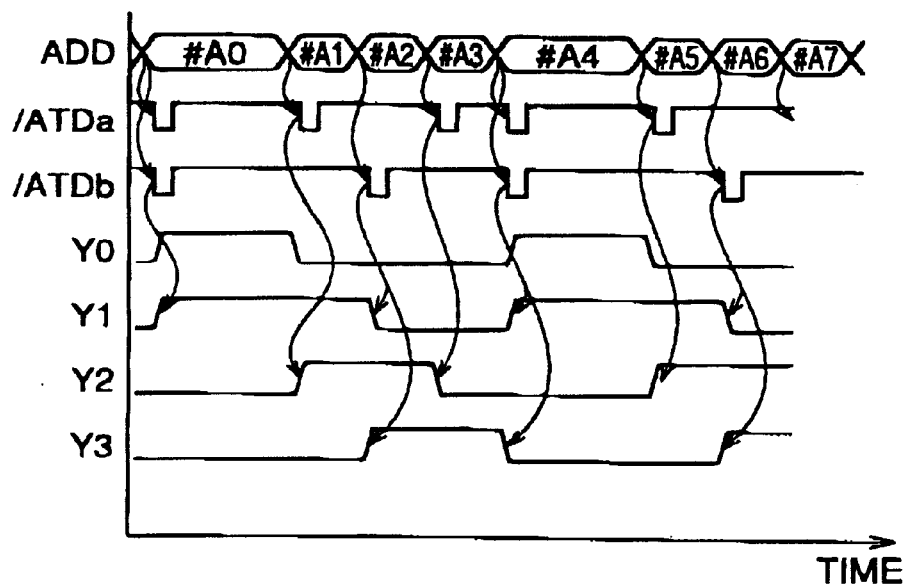
FIG. 14 is a timing chart illustrating production of the column selection signals Y0 to Y3 by column decoder 50.

Referring to FIG. 14, addresses #A0 to #A3 belong to the same address cycle, and addresses #A4 to #A7 belong to the following address cycle. In response to the change in input address, ATD generation circuit 61 generates the address transition detection signals/ATDa and /ATDb at the timing described in connection with FIG. 12.

Regardless of the levels of the address transition detection signals/ATDa and /ATDb, the column selection signal Y0 is activated for the period during which the internal address bits a0 and a1 are both at L level. The signal level of the column selection signal Y1 changes in response to activation of the address transition detection signal/ATDb. The signal level of the column selection signal Y3 changes at the same timing as the column selection signal Y1, and this signal level is complementary to that of the column selection signal Y1. The column selection signal Y2 changes in response to activation of the address transition detection signal/ATDa.

Accordingly, at the start of a new address cycle, the column selection signals Y0 and Y1 are both activated. As a result, the read data is produced in the sense amplifier circuits corresponding to the respective sub data blocks of each data block.

In response to the change from address #A0 to #A1, the address transition detection signal/ATDa is activated, whereby the column selection signal Y2 changes to H level, and the column selection signal Y0 changes to L level. Thus, sense amplifier circuits SA0a to SA7a conduct a new data read operation. The read data in sense amplifier circuits SA0b to SA7b are retained.

In response to the change from address #A1 to #A2, only the address transition detection signal/ATDb is activated. In response to this, the column selection signal Y1 changes from H level to L level, and the column selection signal Y3 changes from L level to H level. As a result, sense amplifier circuits SA0b to SA7b conduct a new data read operation.

Moreover, in response to the change from address #A2 to #A3, the column selection signal Y3 is maintained at H level, whereas the column selection signal Y2 changes from H level to L level.

By setting the respective signal levels of the column selection signals Y0 to Y3 in this way, the data read operation as described in connection with FIG. 4 can be realized.

Note that, in the present embodiment, the page-mode reading is described in which the address is changed with the lower two address bits. However, the page-mode reading using the lower J bits (where J is a natural number; $J \geq 3$) is also possible. In this case, $2^J(=K)$ addresses are belong to the same address cycle.

In this case, the selection as conducted with the column selection signals Y0 to Y3 in the case of J=2 must be conducted with $2^J$ column selection signals. Therefore, the number of bits of the column selection signals used in first sub column selection circuits YG0aU and YG0bU is reduced correspondingly.

Figure 15:
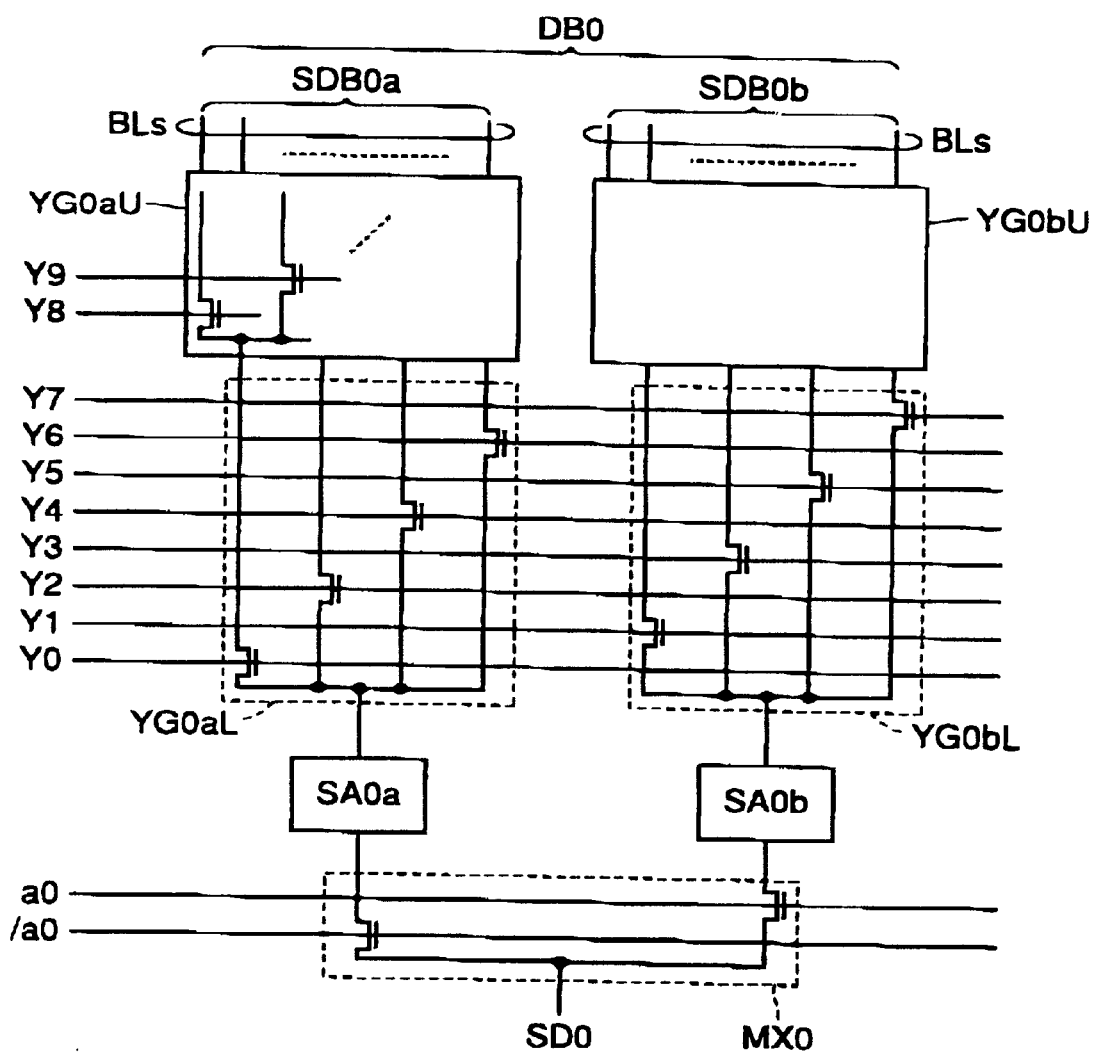
FIG. 15 is a diagram showing the structure of the circuitry associated with column selection in the case where an address is changed with three address bits in the same address cycle.
Figure 16:
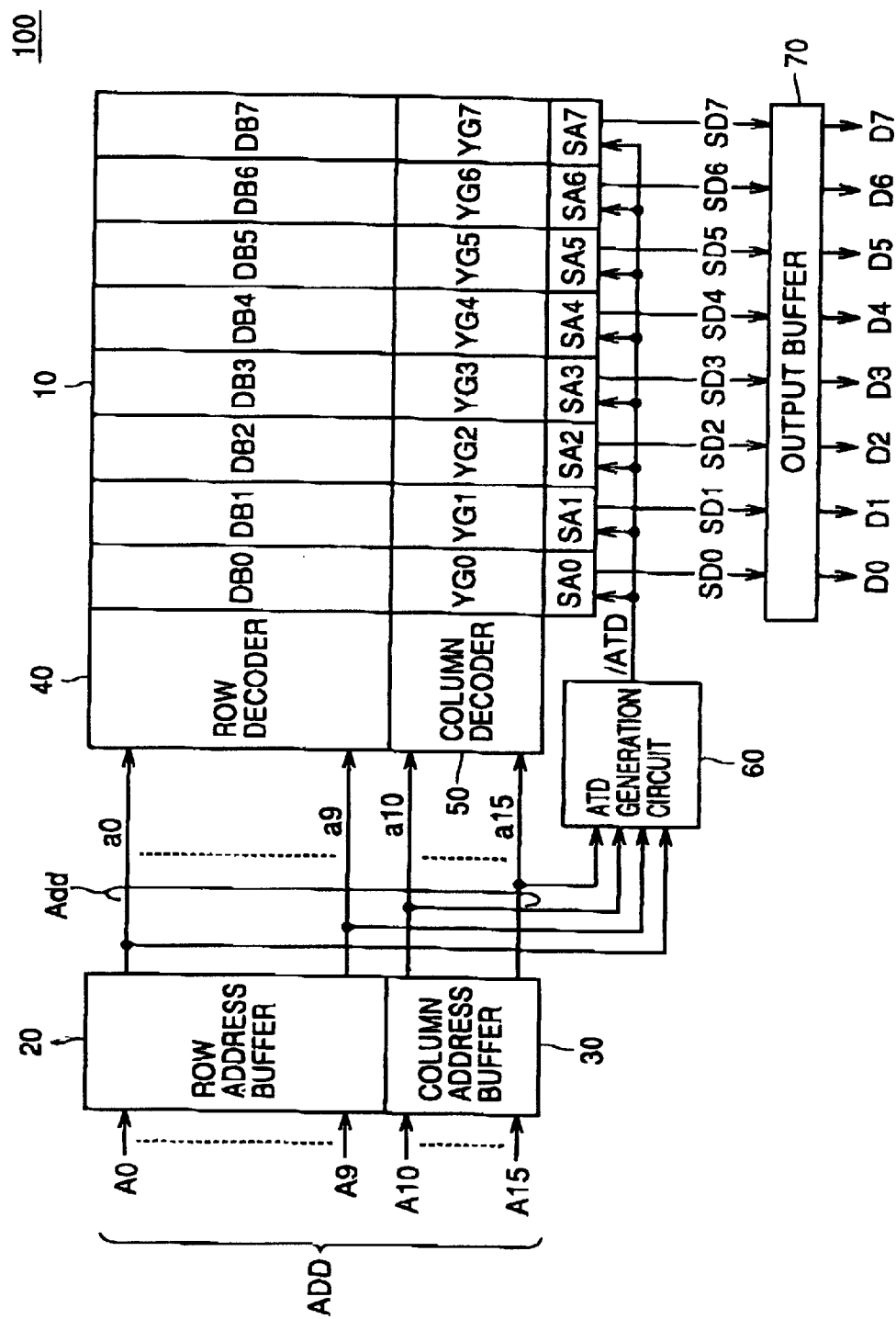
FIG. 16 is a schematic block diagram showing the structure associated with the read operation of a conventional typical semiconductor memory device.
Figure 17:
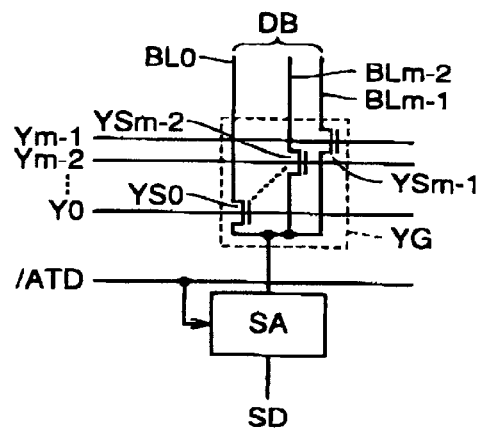
FIG. 17 is a diagram illustrating column selection in semiconductor memory device 100 shown in FIG. 16.
Figure 18:
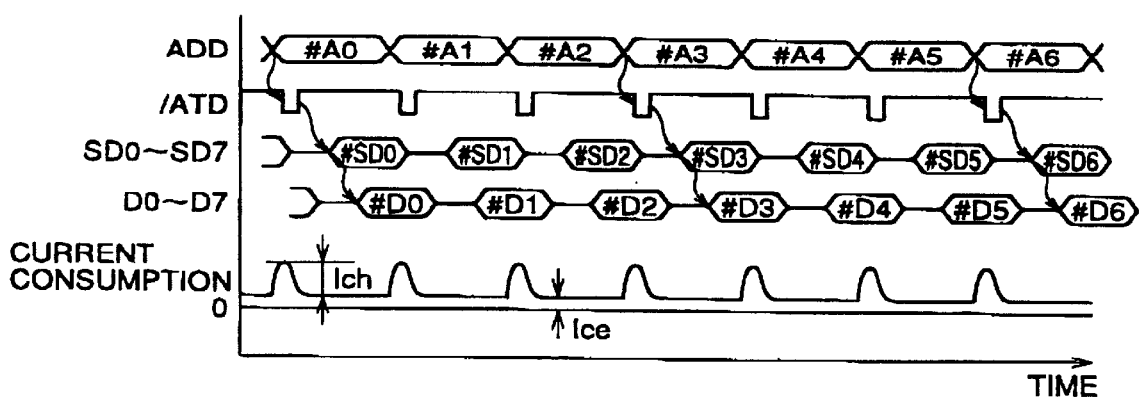
FIG. 18 is a timing chart illustrating the read operation of semiconductor memory device 100 shown in FIG. 16.

FIG. 15 exemplarily shows the structure of the circuitry associated with column selection in the case of J=3.

As compared to FIG. 2A, in the case of J=3, $2^3(=8)$ read data are selected in parallel in each data block DB by first sub column selection circuits YG0aU and YG0bU. Data selection in second sub column selection circuits YG0gL and YG0bL is controlled by $2^3(=8)$ column selection signals Y0 to Y7. The structure of multiplexers MX0 to MX7 for selecting the output of sense amplifier circuits SAa and SAb is determined according to the number of sense amplifiers, i.e., the number (N) of sub data blocks in each data block. Since each data block is provided with two sense amplifiers, multiplexers MX0 to MX7 can have the same structure as that of FIG. 2A.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device for conducting data output in response to K addresses from first to Kth addresses having at least one bit in common (where K is a natural number; $K \geq 2$), comprising:

a data block having a plurality of memory cells arranged in a matrix, said data block being divided into N sub data blocks (where N is a natural number; $N \geq 2$);

N sense amplifier circuits provided corresponding to the respective sub data blocks for amplifying read data transmitted thereto;

N first data selection circuits provided corresponding to the respective sub data blocks, each of said first data selection circuits conducting a first data selection for selecting L read data in a corresponding one of said N sub data blocks (where L is a natural number given by K/N);

N second data selection circuits provided corresponding to the respective sub data blocks, each of said second data selection circuits conducting a second data selection for selecting one of the L read data in a corresponding one of said N first data selection circuits;

a decode circuit for switching said first and second data selection in said N first and second data selection circuits according to the addresses; and a third data selection circuit provided corresponding to said data block, for receiving the N read data respectively amplified by said N sense amplifier circuits, and selected by a combination of said first and second data selection in said N sub data blocks, and for selectively outputting the read data corresponding to the addresses.

2. The semiconductor memory device according to claim 1, wherein said K addresses form a same address cycle, and said decode circuit switches selection of the read data in one of said N second data selection circuits sequentially selected in response to each transition of the addresses in the same address cycle.

3. The semiconductor memory device according to claim 2, further comprising an address transition detection circuit for detecting transition of the addresses to instruct said N sense amplifier circuits to amplify new read data, wherein said address transition detection circuit instructs each of said N sense amplifier circuits to amplify new read data, when a new address cycle is started, and said address transition detection circuit instructs one of said N sense amplifier circuits to amplify new read data, in response to input of the second and the following addresses, said one of said N sense amplifier circuits corresponding to the second data selection circuit for which selection of the read data is switched by said decode circuit.

4. The semiconductor memory device according to claim 3, wherein said address transition detection circuit instructs one, of said N sense amplifier circuits to amplify new read data, in response to any one-bit level transition of the addresses.

5. The semiconductor memory device according to claim 2, wherein each of the addresses includes an upper bit and a lower bit, said K addresses have their upper bit in common in the same address cycle, each of said first data selection circuits conducts said first data selection in two corresponding one of said sub data blocks according to the upper bit, and each of said second data selection circuits switches said second data selection in the corresponding one of said sub data blocks according to the lower bit.

6. The semiconductor memory device according to claim 1, wherein said semiconductor memory device is a flash memory.

7. The semiconductor memory device according to claim 1, wherein

N is equal to 2, and said third data selection circuit conducts selection of the read data according to a predetermined one bit of the addresses.

* * * * *